United States Patent [19]
Manning

[11] Patent Number: 5,859,442
[45] Date of Patent: Jan. 12, 1999

[54] CIRCUIT AND METHOD FOR CONFIGURING A REDUNDANT BOND PAD FOR PROBING A SEMICONDUCTOR

[75] Inventor: Troy A. Manning, Boise, Id.

[73] Assignee: Micron Technology, Inc., Boise, Id.

[21] Appl. No.: 760,153

[22] Filed: Dec. 3, 1996

[51] Int. Cl.[6] .......................... H01L 23/58; H01L 27/10; H01L 23/62
[52] U.S. Cl. .......................... 257/48; 257/203; 257/208; 257/360; 324/754; 324/765
[58] Field of Search .............................. 257/48, 360, 203, 257/208; 324/754, 765

[56] References Cited

U.S. PATENT DOCUMENTS

| | | | |
|---|---|---|---|
| 4,609,833 | 9/1986 | Guterman | 307/297 |
| 5,323,350 | 6/1994 | McLaury | 365/208 |
| 5,504,369 | 4/1996 | Dasse et al. | 257/620 |
| 5,619,462 | 4/1997 | McClure | 365/201 |
| 5,818,251 | 10/1998 | Intrater | 324/765 |

*Primary Examiner*—Ngân V. Ngô
*Attorney, Agent, or Firm*—Charles B. Brantley, II

[57] ABSTRACT

An integrated device includes a redundant bond pad for accessing internal circuitry in the event that the main bond pad for that circuitry is difficult to access with testing equipment. Signals from the redundant bond pad are biased to ground during normal operations of the integrated device. In order to test the relevant internal circuitry, a voltage is applied to a Test Mode Enable bond pad, overcoming the bias that grounds the redundant bond pad. In addition, the signal from the Test Mode Enable bond pad serves to ground any transmission from the main bond pad. As a result, the redundant bond pad may be used to test the relevant internal circuitry given its accessible location in relation to the testing equipment.

25 Claims, 8 Drawing Sheets

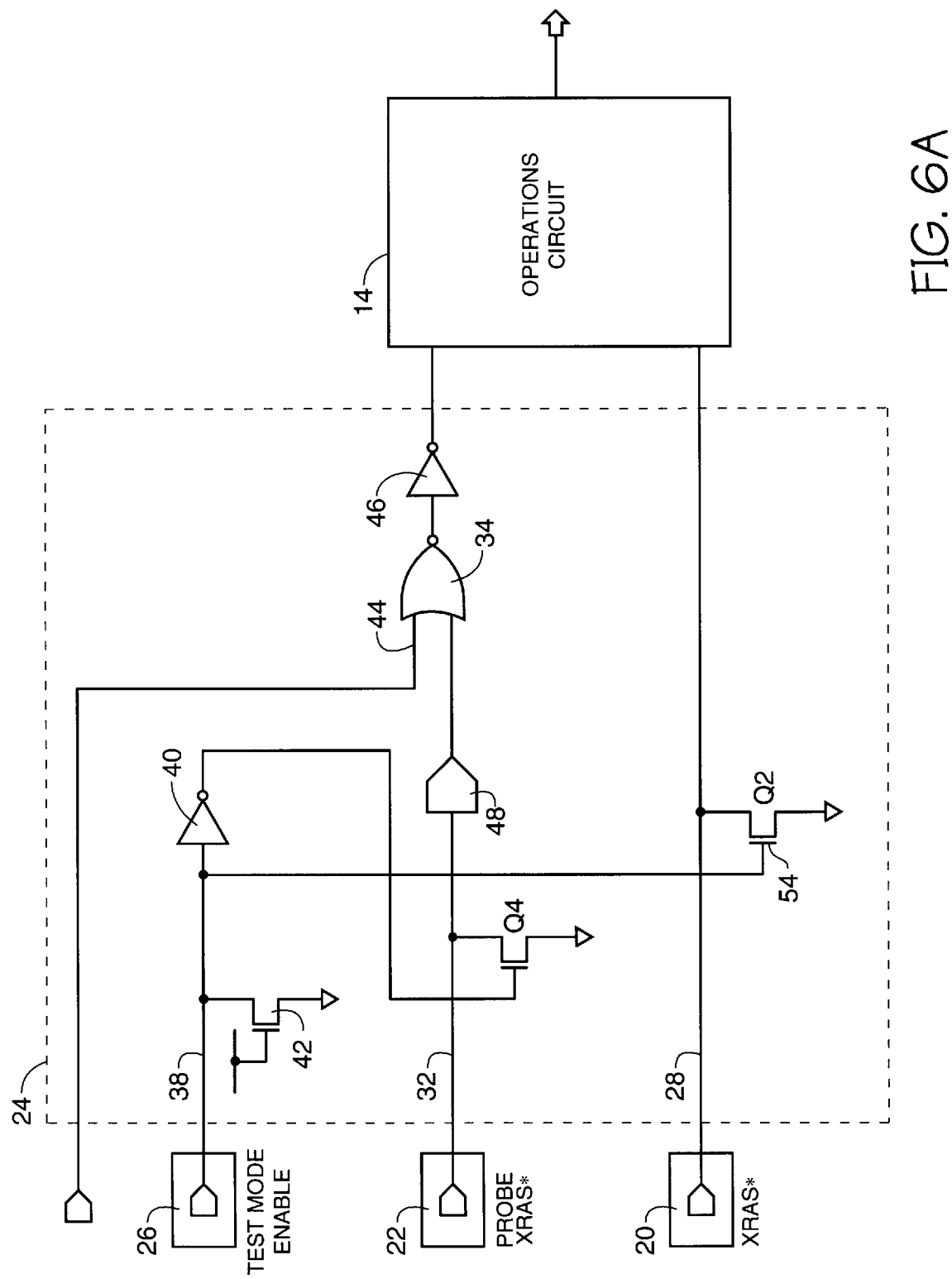

CIRCUIT AND METHOD FOR CONFIGURING A REDUNDANT BOND PAD FOR PROBING A SEMICONDUCTOR

TECHNICAL FIELD

The present invention relates generally to electronic devices and, more specifically, to a circuit for providing a redundant bond pad for probing semiconductor devices.

BACKGROUND OF THE INVENTION

As seen in FIG. 1, one or more dies are formed in a conventional manner on a wafer which, in turn, is formed from a semiconductor material such as silicon. Each die has an integrated circuit or device that has been formed but not yet detached from the wafer. Further, each die on the wafer can be tested by placing a set of mechanical probes in physical contact with the die's bond pads. The bond pads provide a connection point for testing the integrated circuitry formed on the die. The probes apply voltages to the input bond pads and measure the resulting output electrical signals on the output bond pads. Not all bond pads on a die, however, are easily accessible by these devices. Given the dies' arrangement in FIG. 1, for example, it is generally easier to probe the long sides of the die; the short sides of the die are usually too close to the other dies to allow sufficient clearance for testing purposes. Thus, it can be difficult to test circuits that are coupled to an inaccessible bond pad.

Requiring bond pads to be located only in the areas accessible during testing may lead to inefficient and complex circuit layouts. One known solution, as shown in FIG. 3, is to attach another bond pad, one that can be reached by a testing device, to the same wire used by the original bond pad. This solution, however, tends to increase the input capacitance. Attempts at minimizing this capacitance will result in the use of more die space.

A second known solution is to multiplex (mux) two input buffers together, as illustrated in FIG. 4, once again allowing an testable bond pad to access circuitry. With this mux circuit, however, signals from the original pad take longer to reach the die's integrated circuitry. In addition, if input is designed to be received from multiple input buffers in a parallel configuration, this muxing solution would require duplicating large portions of the input circuitry, once again taking up a great deal of die space.

SUMMARY OF THE INVENTION

The present invention provides a circuit allowing an alternate access point to be used in testing the integrated circuitry, wherein the circuitry is usually accessed at another point that is difficult to reach with testing equipment. The resulting advantage of this implementation is that the circuit may be easily tested. As another advantage, the circuit may operate during testing at the same polarity input as used in normal operations of the die without an increase in capacitance. Moreover, the preferred embodiments of this invention may be used to test the circuit without appreciably slowing down the time to input signals. Further, the invention will not require the duplication of circuitry related to the input of data. For purposes of testing in one preferred implementation, the circuit also prevents the use of an input pad employed during normal operation.

BRIEF DESCRIPTION OF THE DRAWINGS

FIG. 6a is a schematic diagram of a second exemplary embodiment of the present invention.

FIG. 6b is a more detailed schematic diagram of the exemplary embodiment in FIG. 6a.

DETAILED DESCRIPTION OF THE PREFERRED EMBODIMENTS

Figure 1:
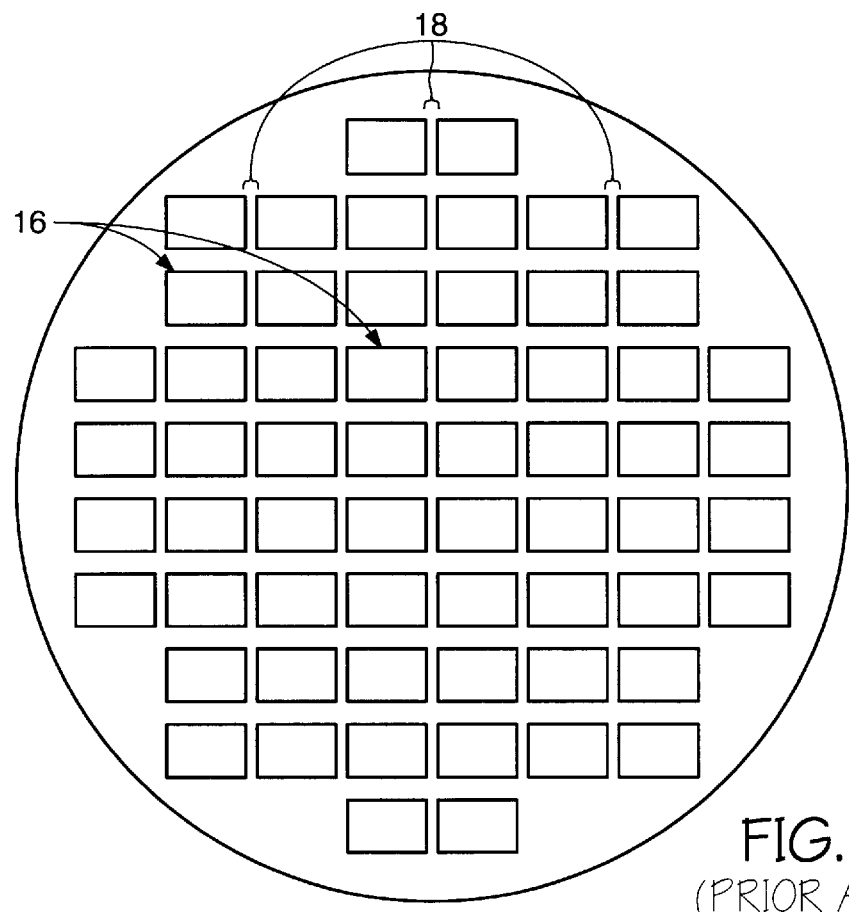
FIG. 1 is a top view of a semiconductor wafer with dies formed thereon as is known in the art.
Figure 2:
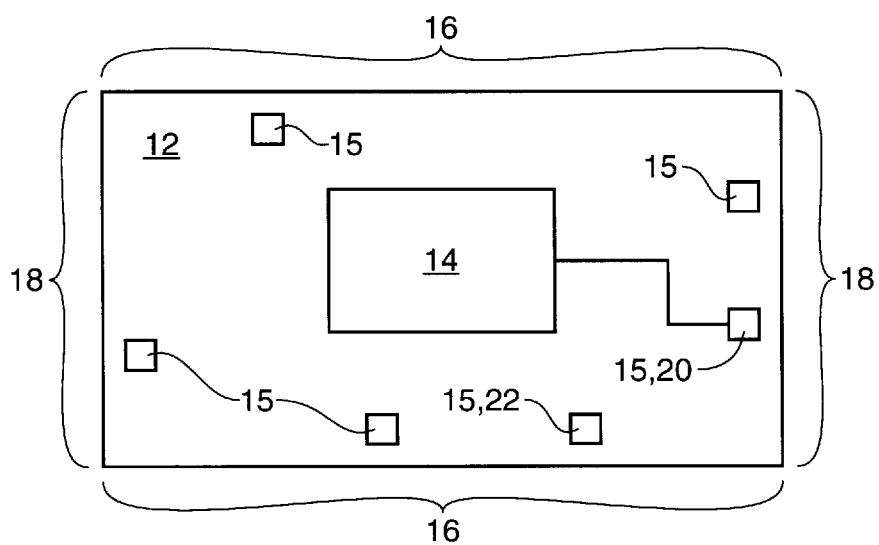
FIG. 2 is a top view of a die of FIG. 1.
Figure 3:
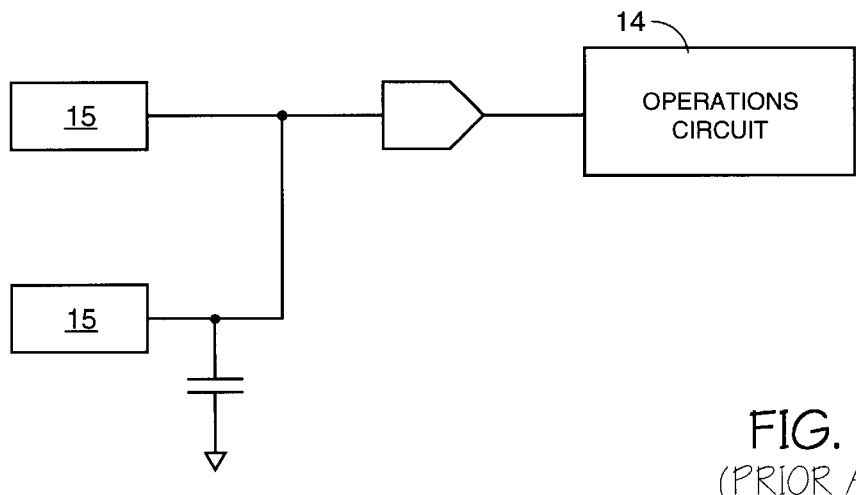
FIG. 3 is a block diagram demonstrating a solution in the prior art for testing the circuitry on a die.
Figure 4:
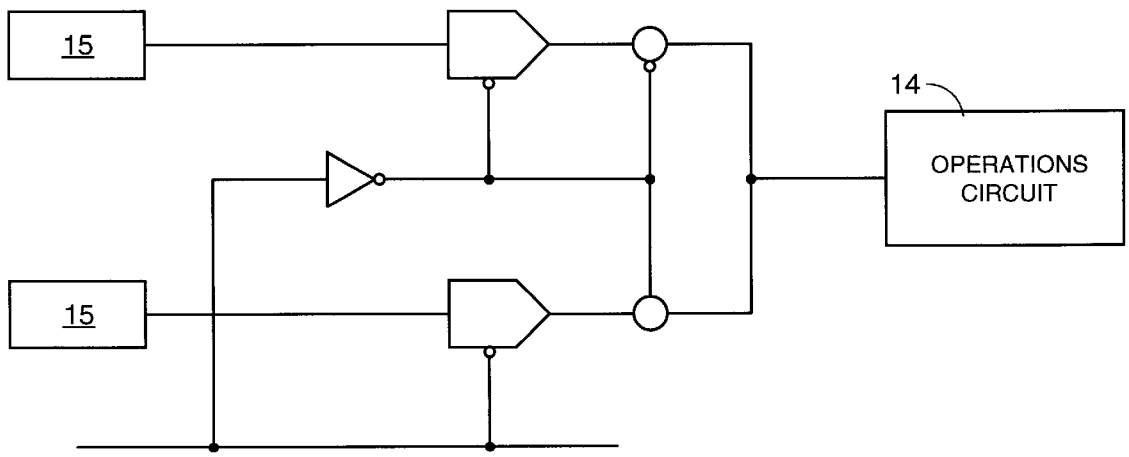
FIG. 4 is a block diagram demonstrating a second such solution in the prior art.

FIG. 2 illustrates the top view of a die 12 that is formed in a conventional manner on a wafer. For purposes of clarity, the wafer and additional dies that may be formed on that wafer have been omitted from FIG. 2. The sides of die 12 contain input bond pads 15, to which external lead wires can be bonded. The bond pads 15 connect to operations circuits 14, such as row address or decoding circuits, within the die 12. It is understood in the art that a die could contain many such bond pads 15 and operations circuits 14. Duplication of these elements has been limited in FIG. 2 for purposes of clarity. Some bond pads 15 are more easily accessible by testing devices than are others. One element affecting accessibility is the spacing between dies 12. For purposes of distinguishing the accessibility of bond pads as illustrated in FIG. 1, areas where the bond pads are more easily accessible are labeled "16," whereas areas where bond pads are relatively inaccessible are denoted by "18."

Occasionally, a particular die 12 is configured so that, during a normal operations mode, an operations circuit 14 is connected to an input bond pad 20 that is in an inaccessible area 18 concerning testing devices. Given such inaccessibility, it can be difficult to apply signals to the operations circuit 14 during a test mode. This is particularly true during the probe of dies that are still part of a wafer. Through the current invention, however, a probe bond pad 22 in an accessible area 16 can be connected to the operations circuit 14 during the test mode, thereby allowing for easy testing.

Figure 5A:
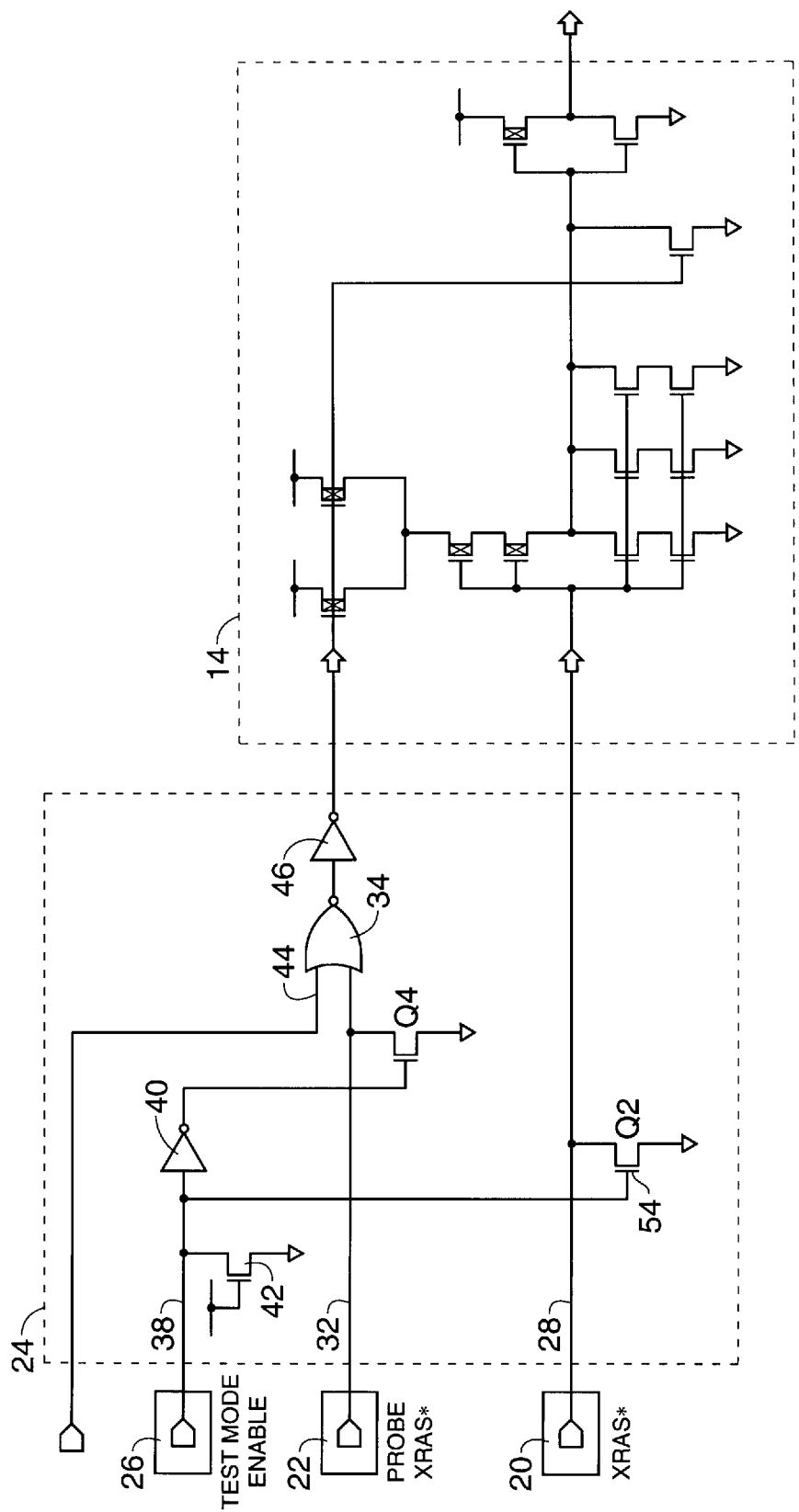
FIG. 5a is a schematic diagram of one exemplary embodiment in accordance with the present invention.

An exemplary testing circuit 24, described below in detail and illustrated in FIG. 5a, is used to connect the probe pad 22 to the operations circuit 14 during the test mode for that circuit. The operation of the testing circuit 24 is controlled by an enable signal. In the preferred embodiment, this signal is provided by the testing device through a Test Mode Enable bond pad 26. Thus, during the test mode, the testing device transmits the enable signal by way of the Test Mode Enable bond pad 26. In response, the testing circuit 24 couples the probe bond pad 22 to the operations circuit 14, which is normally driven by signals applied to input bond pad 20.

Figure 5B:
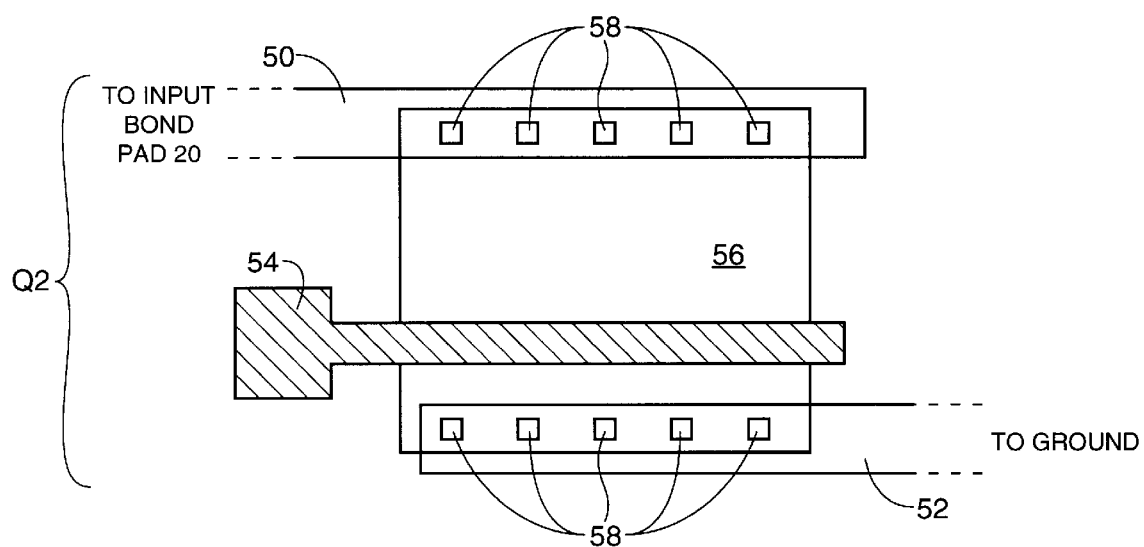
FIG. 5b is an top-down view of a transistor configured for protection against electrostatic discharge.

FIG. 5a is a schematic diagram of one embodiment of the testing circuit 24. The testing circuit 24 contains a first conducting path 28 from the input bond pad 20 to the operations circuit 14. The first conducting path 28 is also coupled to the drain of a first n-channel transistor Q2, which has a source coupled to ground. This first n-channel transistor Q2 is also configured for electrostatic discharge (ESD) protection, as illustrated in FIG. 5b. As with standard transistors of this type, the first n-channel transistor Q2 is comprised of a first conductive strip 50, which, in this case, leads to the first conducting path 28 and, ultimately, to input bond pad 20. A second conductive strip 52 leads to ground, and a gate 54 is interposed between the first and second conductive strips 50 and 52. Further, there exists an n+ active area 56 between the gate 54 and the first conductive strip 50. This n+ active area 56 is preferably in a vertical arrangement with said first conductive strip 50 and communicates with that strip 50 via a series of contacts 58. Unlike standard transistors, this n+ active area 56 is sufficiently large enough to create a relatively high active area resistance, generally around 1 K$\Omega$, thereby preventing ESD damage.

Returning to FIG. 5a, a second conducting path 32 connects the probe bond pad 22 with a NOR gate 34. The second conducting path 32 is also coupled to the drain of a second n-channel transistor Q4. A third conducting path 38 couples the Test Mode Enable bond pad 26 with a first inverter 40. Between these two devices, however, the third conducting path 38 is also coupled with the gate 54 of the first n-channel transistor Q2 as well as a low-bleed current device, known to those skilled in the art as a long L device 42. The first inverter 40 has an input coupled to the third conducting path 38 and an output coupled to the gate of the second n-channel transistor Q4. The NOR gate 34 has a first input 44, which receives an enabling signal for the operations circuit 14. The NOR gate 34 also has a second input coupled to the second conducting path 32, and an output. Finally, the circuit contains a second inverter 46, which has an input coupled to the output of the NOR gate 34. The output of the second inverter 46 is coupled with the operations circuit 14.

Figure 5C:
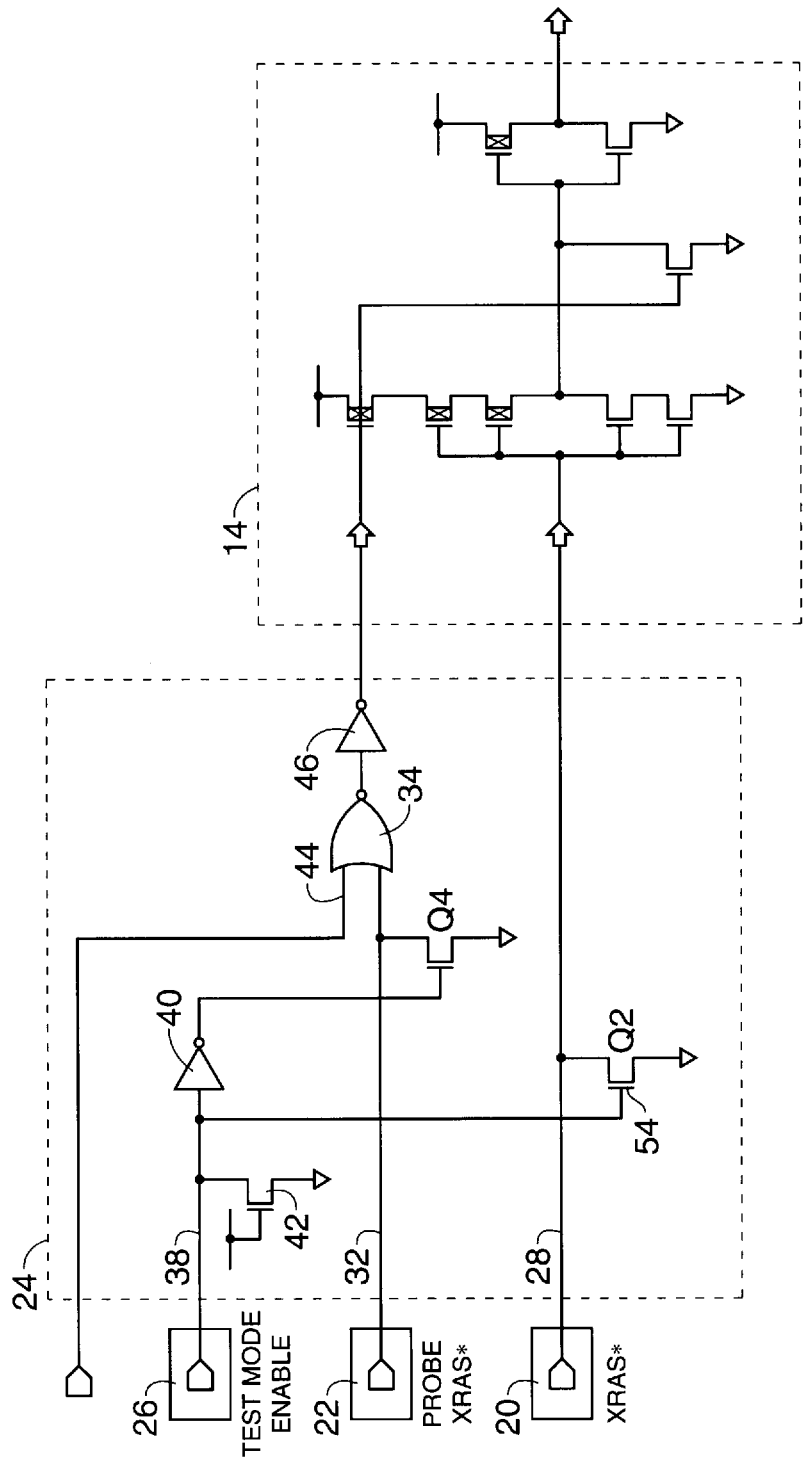
FIG. 5c is a schematic diagram of the exemplary embodiment of FIG. 5a as used with a modified operations circuit.

During normal use of the operations circuit 14, the Test Mode Enable bond pad 26 is not receiving an enabling signal from any testing device. Therefore, the long L device 42 serves to bleed to ground any remaining low current within the third conducting path 38. The lack of current in the third conducting path 38 turns off the first n-channel transistor Q2. With the first n-channel transistor Q2 off, the first conducting path 28 may freely transmit signals from the input bond pad 20 to the operations circuit 14. In the schematic illustrated in FIG. 5a, the signal transmitted by the input bond pad 20 is an external Row Address Strobe (XRAS*) signal. Further, operations circuit 14 is an input buffer which accepts the industry standard input levels of the transmitted XRAS* signal and modifies them to internal $V_{cc}$ and ground levels. It is known that such a circuit may have different configurations. The operations circuit in FIG. 5c demonstrates an alternate configuration, wherein optional transistors have been omitted, including those used for further tuning the XRAS* signal.

Returning to the third conducting path 38, the lack of current in that path results in a logic 0 value transmitted to the first inverter 40. It follows that the output of the first inverter is at logic 1, which turns on the second n-channel transistor Q4. Once activated, the second n-channel transistor Q4 bleeds current from the second conducting path 32, thereby grounding any signals from probe bond pad 22.

Because the second conducting path 32 is at logic 0 during normal operations mode, the signal reaching the operations circuit 14 from the second inverter 46 will match the control logic signals received by the first input 44 of the NOR gate 34. For example, given a logic 1 value received by the first input 44 and the logic 0 of the second input, the output of the NOR gate will be a logic 0, which will be inverted by the second inverter 46 to logic 1. This logic 1 will serve as an input for the operations circuit 14. If, on the other hand, the first input 44 receives a logic 0, the two logic 0 inputs for the NOR gate 34 result in a logic 1 output, which is inverted by the second inverter to result in a logic 0 being input into the operations circuit 14.

During the test mode of the operations circuit 14, the Test Mode Enable bond pad 26 is driven with a sufficient voltage to overcome the bleeding effects of the long L device 42 and send a signal of logic 1 to the third conducting path 38. This signal turns on the first n-channel transistor Q2, thereby grounding any input signal that would come from the input bond pad 20. The logic 1 signal of the third conducting path 38 also goes through the first inverter 40. The resulting logic 0 value turns off the second n-channel transistor Q4 that had been grounding signals from the probe bond pad 22. As a result, signals such as XRAS* that once issued from the input bond pad 20 may now be input using the more accessible probe bond pad 22. The NOR gate 34 receives both a signal enabling the operations circuit 14 as well as transmissions from the probe bond pad 22. The NOR gate 34 output is inverted by the second inverter 46, and the result is entered into the operations circuit 14.

Figure 6B:
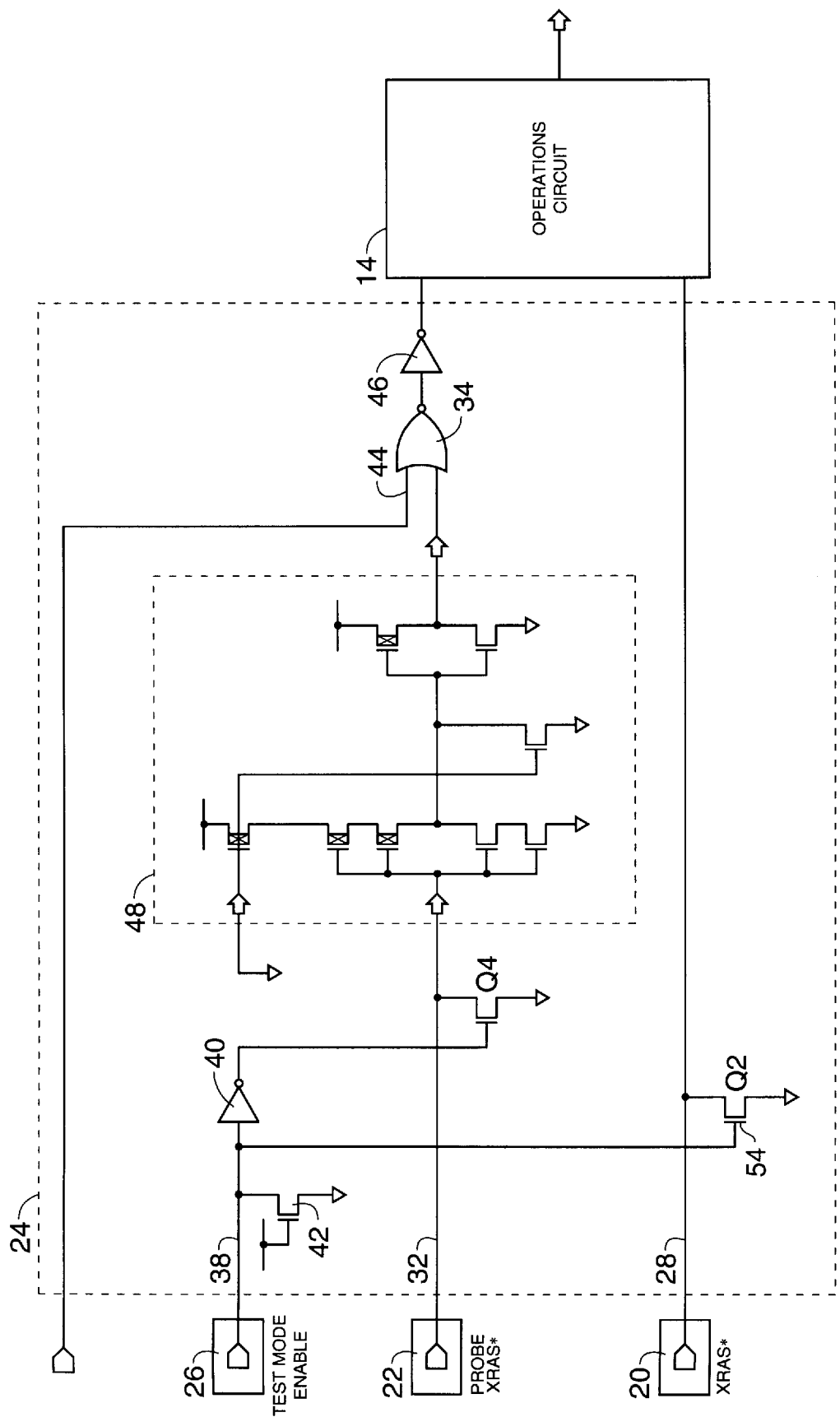

In another embodiment illustrated in FIG. 6a and 6b, a second input buffer 48 may be used with the probe bond pad 22 in order to preserve a trip point equivalent to that of other bond pads 15. In this embodiment, the second input buffer 48 has a configuration similar to that of the operations circuit 14 of FIG. 5c.

Figure 7:
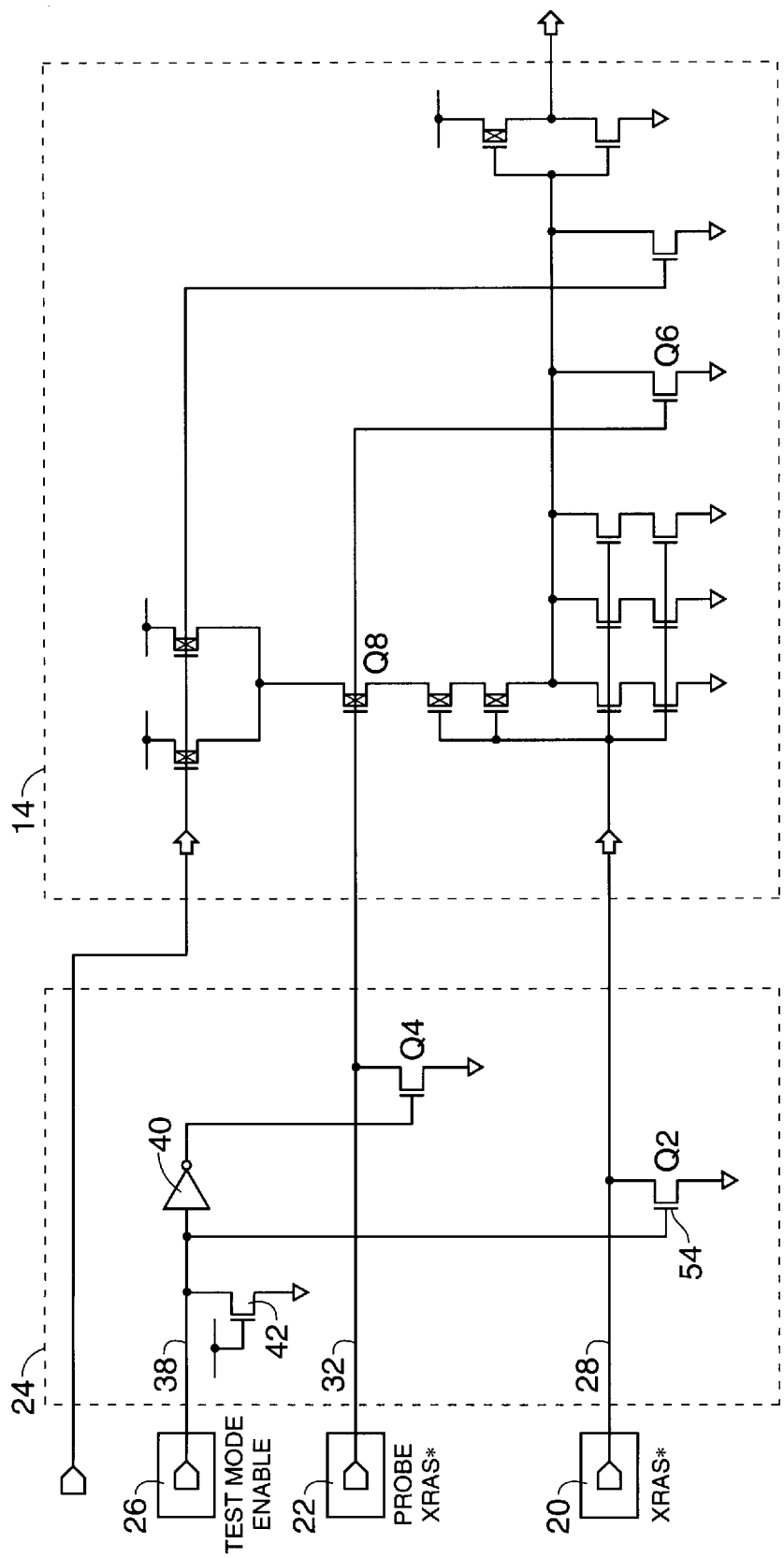
FIG. 7 is a schematic diagram of a third exemplary embodiment of the present invention.

In a third embodiment, shown in FIG. 7, the signals that passed through the NOR gate 34 and the second inverter 46 in earlier embodiments are instead coupled directly into the operations circuit 14 with the addition of one n-channel transistor Q6 and one p-channel transistor Q8. This embodiment has the benefit of allowing multiple points of access for test signals, rather than requiring all of the test signals to be input at only one location. This is not the most preferred embodiment, however, as the additional transistors Q6 and Q8 require additional die space.

One of ordinary skill in the art can appreciate that, although specific embodiments of this invention have been described above for purposes of illustration, various modifications may be made without departing from the spirit and scope of the invention. For example, the testing circuit could be modified so that a single Test Mode Enable pad could enable a plurality of probe bond pads, while simultaneously grounding the corresponding input bond pads. It is also possible to configure the testing circuit to provide for probe bond pads for measuring the output of an operations circuit in the event the output bond pad is inaccessible. Accordingly, the invention is not limited except as stated in the claims.

What is claimed is:

1. An integrated circuit comprising:

at least one test circuit;

at least one main bond pad coupled to said test circuit;

at least one probe bond pad corresponding to said main bond pad and coupled to said test circuit;

a test signal conduit coupled to said test circuit;

at least one main circuit coupled to said test circuit; wherein said test circuit is configured to propagate signals between said main bond pad and said main circuit, and said test circuit is further configured to selectively propagate signals between said probe bond pad and said main circuit in response to a signal carried by said test signal conduit.

2. The integrated circuit of claim 1, wherein said test signal conduit is configured to carry a test vector to said test circuit.

3. The integrated circuit of claim 1, wherein said test signal conduit is a test-mode-enable bond pad.

4. An integrated device comprising:
a first bond pad in selective electrical connection with a first conductive path;
a second bond pad in selective electrical connection with a second conductive path; and
a selection circuit coupled to said first and second conductive paths, wherein said selection circuit operable to receive an enable signal that has a first value during a first operational mode of said integrated device and a second value during a second operational mode of said integrated device, and wherein said selection circuit is operable to couple said first bond pad to said first conductive path in response to said first value; said selection circuit further operable to couple said second bond pad to said second conductive path in response to said second value.

5. The device in claim 4, wherein said selection circuit is further operable to decouple said first bond pad from said first conductive path in response to said second value.

6. The device in claim 5, further comprising a buffer interposed between said second bond pad and said second conductive path.

7. The device in claim 6, wherein said first and second bond pads are configured to receive input signals.

8. A semiconductor wafer comprising:
a plurality of semiconductor dies, each die having a first area and a second area, each die comprising:
a first bond pad in said first area;
a second bond pad in said second area;
a test signal conductive path;
a circuit; and
a testing device coupled to said first bond pad, said second bond pad, said test signal conductive path, and said circuit, wherein said testing device is operable to allow transmission of signals between said circuit and said first bond pad, and said testing device is further operable to establish the transmission of signals between said circuit and said second bond pad upon a test signal sent by way of said test signal conductive path.

9. A switching device for an operations circuit comprising:
a first conductive path coupled to said operations circuit;
a second conductive path coupled to said operations circuit;
a first bond pad coupled to said first conductive path;
a second bond pad coupled to said second conductive path;
a selection circuit coupled to a third bond pad, said first conductive path, and to said second conductive path, wherein said selection circuit is configured to allow grounding of said second conductive path during a first mode of operation of said operations circuit and grounding of said first conductive path during a second mode of operation of said operations circuit.

10. The device in claim 9, wherein said selection circuit is further configured to prevent grounding of said second conductive path during said second mode of operation and to prevent grounding of said first conductive path during said first mode of operation.

11. The device in claim 10, further comprising a control logic signal conduit coupled to said second conductive path.

12. The device in claim 10, further comprising a control logic signal conduit directly coupled to said operations circuit.

13. The device in claim 12, wherein said second bond pad is coupled directly to said operations circuit.

14. A switching assembly for an operations circuit, comprising:
an output node coupled to said operations circuit;
a primary input selectively coupled to said output node;
a test input selectively coupled to said output node of said assembly; and
a selection mechanism electrically interposed between said inputs and said output.

15. The switching assembly in claim 14, further comprising:
a test-mode-enable input coupled to said selection mechanism and configured to carry a test signal to said selection mechanism, wherein said selection mechanism is configured to allow electrical communication between said test input and said operations circuit in response to said test signal.

16. The switching assembly of claim 15, wherein said selection mechanism is further configured to prevent electrical communication between said test input and said operations circuit in the absence of said test signal.

17. A testing circuit for an operations circuit comprising:
a main output terminal coupled to a main input terminal;
a first electrically grounding device interposed between said main output terminal and said main input terminal;
a test output terminal coupled to a test input terminal;
a second electrically grounding device interposed between said test output terminal and said test input terminal; and
a test-mode-enable input terminal coupled to said first and second electrically grounding devices, wherein said test-mode-enable input terminal is configured to selectively drive said electrically grounding devices.

18. The testing circuit of claim 17, wherein:
said first electrically grounding device is a first n-channel transistor having a first gate, wherein said first electrically grounding device is configured for ESD protection; and
said second electrically grounding device is a second n-channel transistor having a second gate.

19. The testing circuit of claim 18, further comprising:
an inverter having an inverter output coupled to said second gate and an inverter input coupled to said test-mode-enable input terminal; and
a conducting path interposed between said inverter input and said test-mode-enable input terminal, wherein said conducting path is connected to said first gate.

20. The testing circuit of claim 19, further comprising:
a third electrically grounding device interposed between said test-mode-enable input terminal and said conducting path, wherein said third electrically grounding device is biased to generally prevent the transmission of signals from said test-mode-enable input terminal.

21. The testing circuit of claim 20, wherein said third electrically grounding device is a long L device.

22. A testing apparatus for an operations circuit coupled to a primary pad, said testing apparatus comprising:
- a mode-enable path coupled to said operations circuit, wherein said mode-enable path has a trip point and is configured to transmit a forcing voltage; and
- a redundant pad coupled to said mode-enable path and to said operations circuit, wherein said redundant pad is configured to emulate said primary pad in response to a transmission of said forcing voltage through said mode-enable path.

23. The testing apparatus of claim 22, wherein said operations circuit has an enabling function, and said redundant pad is configured to control said enabling function in response to said transmission of said forcing voltage.

24. The testing apparatus in claim 23, further comprising a mode-enable pad coupled to said mode-enable path, wherein said mode-enable pad is configured to receive said forcing voltage.

25. The testing apparatus in claim 24, wherein said operations circuit is an input buffer.

* * * * *

UNITED STATES PATENT AND TRADEMARK OFFICE
CERTIFICATE OF CORRECTION

PATENT NO : 5,859,442

DATED : January 12, 1999

INVENTOR(S) : Troy A. Manning

It is certified that error appears in the above-identified patent and that said Letters Patent is hereby corrected as shown below:

In claim 14 (column 6, line 20) add --node-- at the end of the sentence.

Signed and Sealed this

Twenty-eighth Day of December, 1999

Attest:

Q. TODD DICKINSON

Attesting Officer

Acting Commissioner of Patents and Trademarks